United States Patent
Perera et al.

(10) Patent No.: US 12,203,874 B2
(45) Date of Patent: *Jan. 21, 2025

(54) EUV MICROSCOPE

(71) Applicant: EUV TECH, INC., Martinez, CA (US)

(72) Inventors: Chami N. Perera, Martinez, CA (US); David C. Houser, Martinez, CA (US); Charles G. Murray, Martinez, CA (US); Alexander N. Khodarev, Martinez, CA (US); Travis W. Grodt, Martinez, CA (US)

(73) Assignee: EUV Tech, Inc., Martinez, CA (US)

( * ) Notice: Subject to any disclaimer, the term of this patent is extended or adjusted under 35 U.S.C. 154(b) by 241 days.

This patent is subject to a terminal disclaimer.

(21) Appl. No.: 17/893,862

(22) Filed: Aug. 23, 2022

(65) Prior Publication Data

US 2023/0121350 A1 Apr. 20, 2023

Related U.S. Application Data

(63) Continuation-in-part of application No. 17/503,071, filed on Oct. 15, 2021, now Pat. No. 11,960,202.

(51) Int. Cl.
  *G01N 21/956* (2006.01)
  *G03F 7/00* (2006.01)

(52) U.S. Cl.
  CPC ....... *G01N 21/956* (2013.01); *G03F 7/70608* (2013.01); *G03F 7/7085* (2013.01); *G01N 2021/95676* (2013.01)

(58) Field of Classification Search
  None
  See application file for complete search history.

(56) References Cited

U.S. PATENT DOCUMENTS

| 5,560,616 | A | 10/1996 | Van |
| 6,864,490 | B1 | 3/2005 | Underwood et al. |
| 11,960,202 | B1 * | 4/2024 | Perera ............... G02B 21/0016 |
| 2022/0167492 | A1 | 5/2022 | Na et al. |

FOREIGN PATENT DOCUMENTS

TW  M657713 U  7/2024

OTHER PUBLICATIONS

U.S. Appl. No. 17/503,071, Notice of Allowance mailed Dec. 21, 2023, 9 pgs.

* cited by examiner

*Primary Examiner* — Edwin C Gunberg
(74) *Attorney, Agent, or Firm* — Polygon IP, LLP

(57) ABSTRACT

An EUV microscope apparatus utilizing a source of EUV light. The light is sent to a collector which creates a first focused EUV beam. A monochromator module receives the first focused EUV beam and produces a second focused EUV beam that is passed to an illumination module. The output of the illumination module is reflected off a mask. The reflected beam from the mask is sent to a zone-plate and a detector to produce an image.

17 Claims, 5 Drawing Sheets

EUV MICROSCOPE

CROSS-REFERENCES TO RELATED APPLICATIONS

The present application is a Continuation-In-Part of U.S. patent application Ser. No. 17/503,071, filed 15 Oct. 2021.

BACKGROUND OF THE INVENTION

The present application relates to a novel and useful EUV mask imaging tool or extreme ultraviolet (EUV) microscope, for use with EUV lithography masks used to produce electronic chips.

Prior EUV mask imaging devices have been proposed to assess the quality of EUV masks. For example, U.S. Pat. No. 6,738,135 depicts a novel system for inspecting lithography masks that are sometimes referred to as zone-plate microscopes.

It is realized that zone-plate microscopes are highly chromatic, having a wave-length dependent focal length. If not controlled, this characteristic leads to poor resolution. Since chromatic effects are focal-length dependent, the shorter the focal length of these devices, the less important chromatic effects become.

In U.S. Pat. No. 6,738,135, a sufficiently short focal length was achieved in order to handle the full typical bandwidth supported by Mo/Si multilayer optics. Although successful, certain drawbacks existed. Namely, the system working distance of this prior art device was severely constrained. Moreover, the corrective implementation of a zone-plate central stop to filter out zone-plate zero order flare may not be used, since at short working distances, the central stop of such zone-plate would occupy too large a fraction of the full light aperture to be viable.

An EUV microscope apparatus for analyzing EUV masks in an efficient manner would constitute a notable advance in the electronic arts.

SUMMARY OF THE INVENTION

In accordance with the present application, the above delineated problems are solved by using a monochromator which further narrows the bandwidth of the generated EUV beam and, thus, allows for a longer working distance.

The EUV mask imaging tool apparatus includes as one of its elements a source of a beam or emanation of EUV light. Such emanation may originate with a laser-produced plasma, a discharged-produced plasma, and the like. The beam of EUV light is forwarded to an optional collector which produces a first focused EUV beam. The optional collector is formed of two mirrors with optical power in series. For example, the collector may include a flat mirror in combination with an elliptical or aspherical mirror. In addition, the collector may take the form of a single mirror, such as a spherical, elliptical, or aspherical mirror. The beam leaving the collector serves as an intermediate focus to subsequent elements of the apparatus of the present application.

First intermediate focused EUV beam from the optional collector passes to a monochromator having entrance and exit slits. Such EUV beam is forwarded to the monochromator, either directly or by way of an intermediate focus produced by the optional collector. The entrance slit of the monochromator can be excluded if the intermediate focus size or real source size is itself smaller that the required entrance slit size. In certain cases, the monochromator itself may be comprised of glancing and/or near normal optics and should ideally include a dispersing element. In essence, when used without a separate collector, the monochromator operates as a condenser and no intermediate focus of the EUV beam from the EUV source is formed. The monochromator is then used to purify the light to the level of $\lambda/\Delta\lambda$ of 350 or better. Thus, a second focused EUV beam passes from the monochromator.

The second focused purified EUV beam from the monochromator is sent to an illumination module or illuminator. Illumination module concentrates the EUV beam leaving the monochromator and directs such EUV beam to the surface of the mask being analyzed. In essence, the illumination module controls the average and angular extent of the light illuminating the mask. In certain cases, the monochromator also functions as the illuminator, obviating the need for a separate illumination module.

The EUV light reflected from the mask passes through a zone-plate. The zone-plate may, optionally, include a central obscuration in order to employ first order light without overlap of zero order light. The light passing through the zone-plate is sent as an image to a detector such as a charge coupled device (CCD) which normally includes a screen where the EUV reflective characteristics of the mask may be viewed by the user. The image may be recorded for subsequent viewing and/or analysis by the user or by automated computer software.

Thus, a novel EUV mask imaging tool is provided which features the use of a non-synchrotron source that delivers partially coherent or incoherent EUV light to an integrated monochromator and a zone-plate having a central stop to mitigate zero order flare.

It is therefore an object of the present application to provide a novel EUV mask imaging tool that efficiently and economically is capable of visualizing and evaluating EUV lithography masks.

Another object of the present application is to provide a novel EUV mask imaging tool that allows visualization and evaluation of EUV masks at a lower cost than EUV imaging/inspection tools of the prior art.

Another object of the present application is to provide a novel EUV mask imaging tool that includes a novel optical design having shorter track length and smaller, easier to maintain imaging optics that are lacking in comparable tools of the prior art.

Another object of the present application is to provide a novel EUV mask imaging tool that eliminates chromatic effects found in prior zone-plate microscopes.

Another object of the present application is to provide a novel EUV mask imaging tool which employs a zone-plate having a central stop, or obscuration, to filter out zone-plate zero order flare.

Another object of the present application is to provide a novel EUV mask imaging tool for visualizing and evaluating EUV lithography masks which is capable of measuring such masks with a high degree of accuracy and repeatability.

Another object of the present application is to provide a novel EUV mask imaging tool which is compatible with conventional mask blank transfer systems and is operational in standard clean rooms, typically used to manufacture semiconductor chips.

The invention possesses other objects and advantages especially as concerns particular characteristics and features thereof which will become apparent as the specification continues.

Reference is made to the following drawings, which further describe the application sought for patenting.

For a better understanding of the application, reference is made to the following detailed description of the preferred embodiments which should be referenced to the above described drawings.

DETAILED DESCRIPTION OF THE PREFERRED EMBODIMENTS

Various aspects of the present application will evolve from the following detailed description thereof which should be referenced to the prior delineated drawings.

Figure 1:
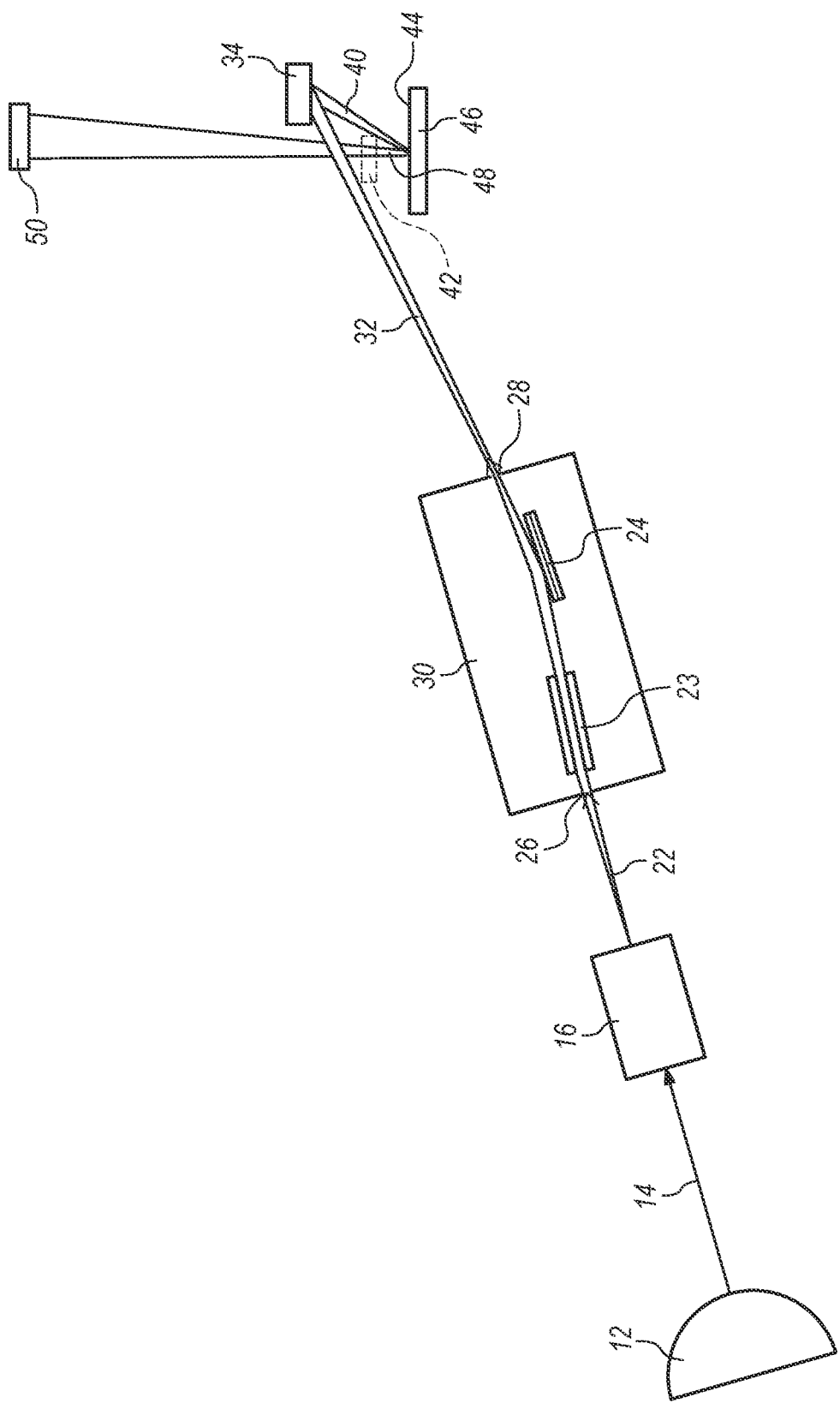
FIG. 1 is a schematic view depicting the elements of an embodiment of the apparatus of the present application.

With reference to FIG. 1, reference character 10 is employed to depict the tool apparatus as a whole. Tool apparatus 10 includes as one of its elements an extreme ultraviolet (EUV) light source 12 which may be a laser produced plasma source. However, EUV light source 12 may also derive from a discharge produced plasma source and the like. The following table represents the optical specifications of tool apparatus 10:

TABLE I

| | |
|---|---|
| EUV wavelength | 13.5 nm |
| EUV source type | Incoherent |
| Illumination size | 10 μm |
| Focal length | 625 μm |
| Band-width ($\lambda/\Delta\lambda$) | >=350 |
| CCD real pixel size | 13 μm |

Figure 5:
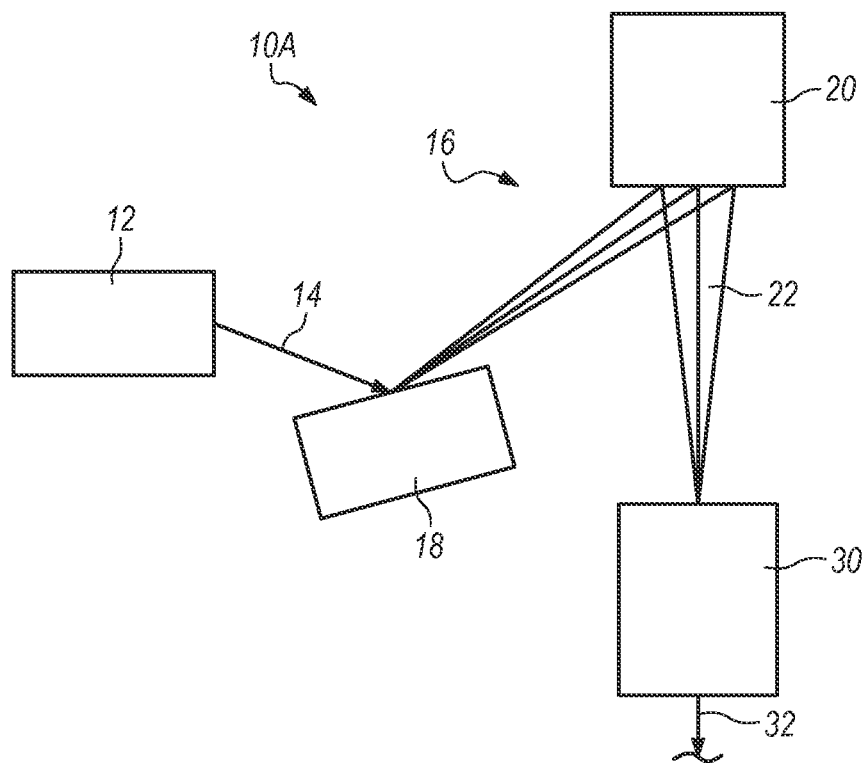
FIG. 5 is a block diagram depicting the apparatus of the present application utilizing a collector having the combination of flat and elliptical or aspherical mirrors.
Figure 6:
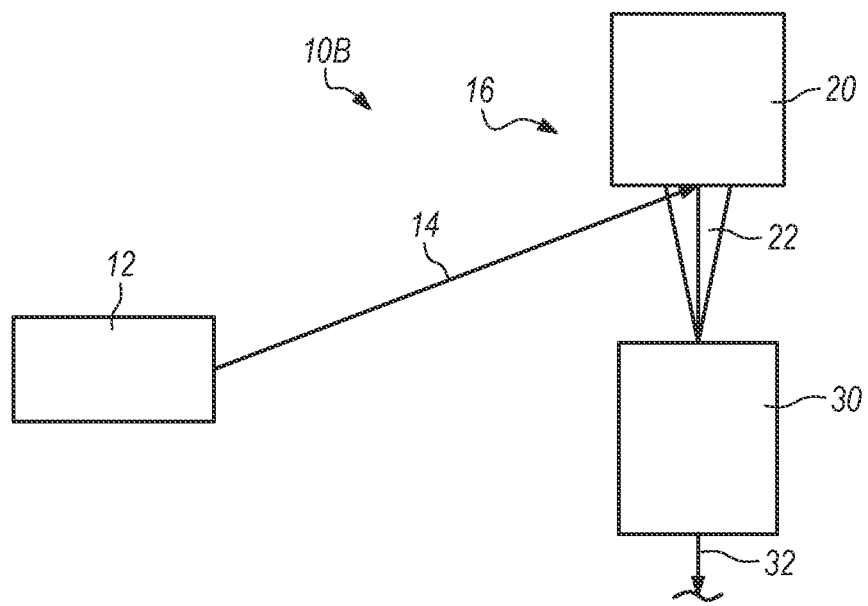
FIG. 6 is a block diagram showing another embodiment of the apparatus of the present application in which the collector utilizes only a single aspherical or elliptical mirror.

Viewing FIG. 1, an EUV beam 14 from source 12 is sent to collector 16 which may take the form of one or two or more mirrors with optical power in series. Collector 16 produces a first focused EUV beam 22. For example, collector 16 of apparatus 10A may include a flat mirror 18 in series with an aspherical or elliptical mirror 20, FIG. 5. However, collector 16 may also include only a single aspherical or elliptical mirror 20 in embodiment 10B, FIG. 6.

Viewing FIG. 1 again, the resulting first focused EUV beam 22 from collector 16 is passed to a monochromator module 30. Monochromator module 30 includes an entrance slit 26 and exit slit 28 on either side. Again, monochromator module 30, thus, performs a focusing function that is used to re-image EUV light from the entrance slit 26 to exit slit 28. In essence, monochromator module 30 is used to purify the received light to a level of $\lambda/\Delta\lambda$ of 350 or better. Monochromator module 30 may take the form of any suitable device known in the art and is available, when used with the collector 16, from EUV Tech Inc. of Martinez, California, under part No. B151667. For example, monochromator module 30 may externalize one having a condenser 23 and a cylindrical grating 24 bringing the UV light to exit slit 28. A second focused EUV beam 32 passes from exit slit 28.

Figure 2:
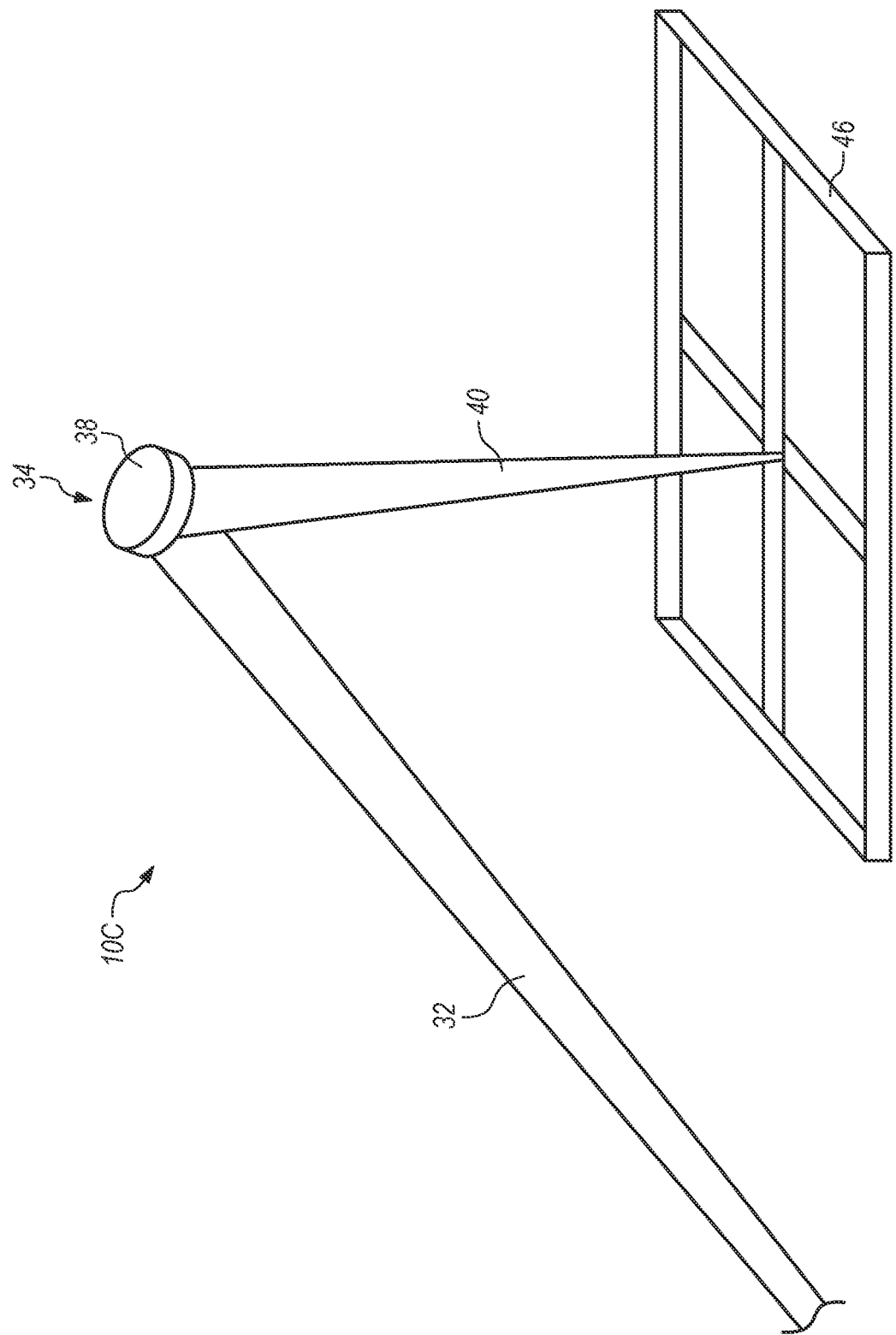
FIG. 2 is an isometric view showing an embodiment of the illumination module of the apparatus of the present application.

Second EUV beam 32, exiting exit slit 28, travels to an illumination module (illuminator) 34, FIG. 1. Illumination module 34 may consist, in one form in embodiment 10A, as a combination of a flat mirror 36 and an elliptical or aspherical mirror 38, FIG. 7. Illumination module 34 may also be formed by a single ellipsoidal or aspherical mirror 38 in embodiment 10C, FIGS. 2 and 8. Illumination module 34 serves both to concentrate the light leaving monochromator module 30 and to define the angular extent of the illumination. Illumination module 34 produces an illumination beam 40 having a width of about 10 μm on the mask 46.

Figure 9:
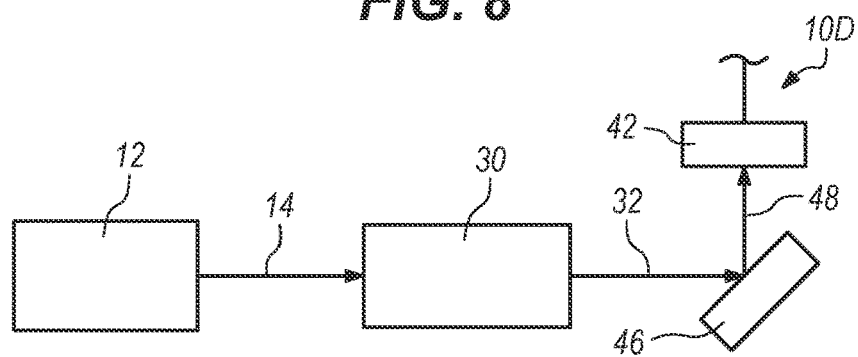
FIG. 9 shows another embodiment of the apparatus of the present application in which the monochromator produces an image without the use of a collector or illuminator.

The functionality of monochromator module 30, illumination module 34, and collector 16 may be combined into a single entity, such as monochromator module 30 in embodiment 10D, FIG. 9. In this embodiment, EUV beam 32 from monochromator module 30 is passed directly to mask 46.

Figure 3:
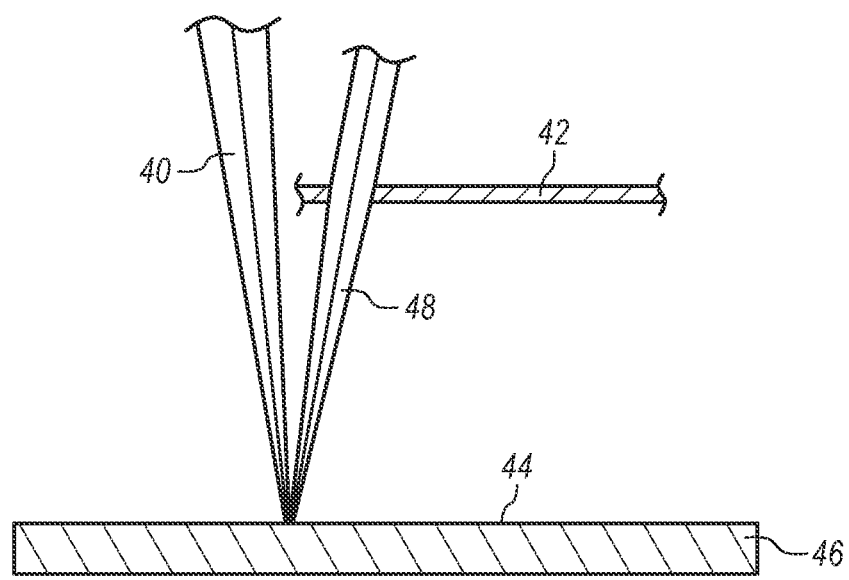
FIG. 3 is a schematic view showing the position of the zone-plate relative to a mask in the apparatus of the present application.
Figure 4:
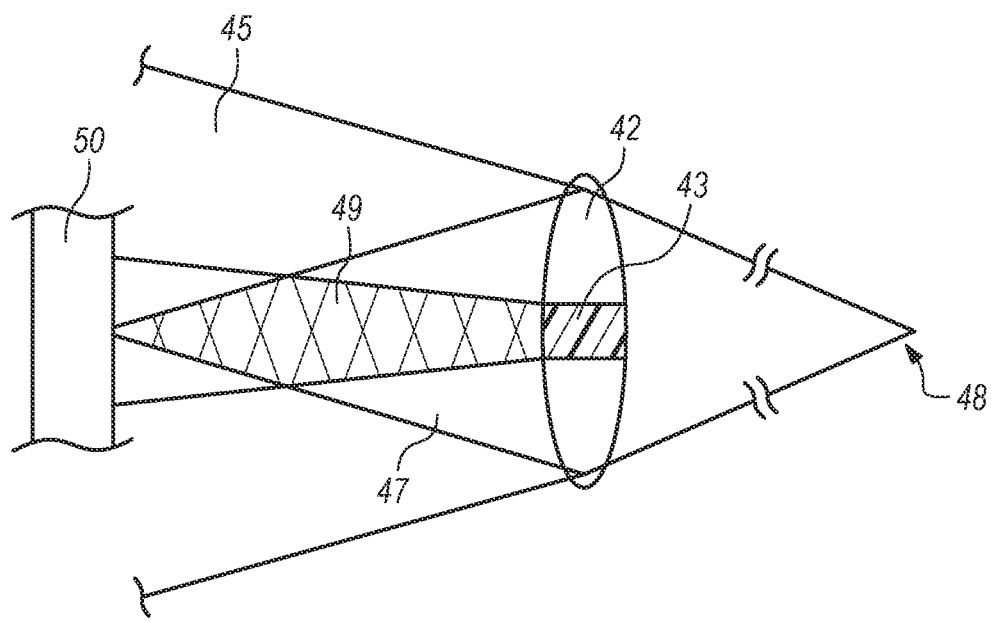
FIG. 4 is a schematic view illustrating the operation of the zone-plate of the apparatus of the present application.
Figure 7:
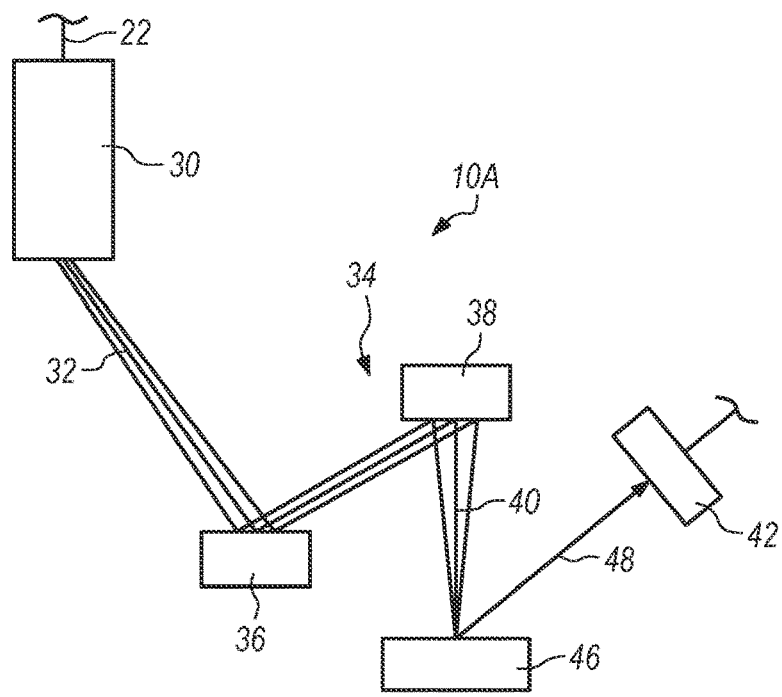
FIG. 7 shows another embodiment of the apparatus of the present application in which the illumination module takes the form of a combination of a flat and aspherical or elliptical mirror.
Figure 8:
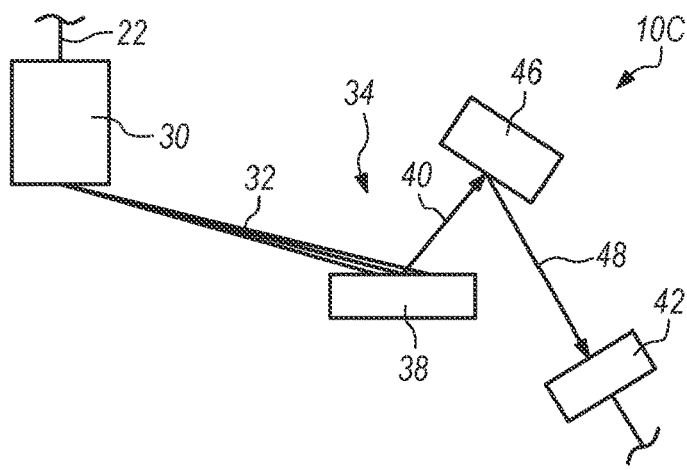
FIG. 8 shows another embodiment of the apparatus of the present application in which a block diagram shows the illumination module in the form of a single aspherical or elliptical mirror.

Viewing again FIG. 1, and FIGS. 3 and 4, the reimaged beam 40, leaving illumination module 34, passes through a zone-plate 42 with the aforesaid 10 μm width illumination beam bearing on surface 44 of mask 46, also FIGS. 7-9. FIG. 3 depicts the position of zone-plate 42 relative to mask 46 and mask surface 44. Zone-plate 42 is shown on FIG. 4 in its functional lens shape. Light beam 48, reflected from mask 46 and passing through zone-plate 42, is sent to an imaging sensor 50 which may be an in-vacuum, cooled charge coupled device (CCD) camera, discussed in greater detail hereinafter. Again, with reference to FIG. 4, zone-plate 42 preferably includes a central obscuration 43 to prevent overlap of zero order light 45 and the diffracted first order light 47 of zone-plate 42. Central obscuration 43 creates a shadow 49 between zone-plate 42 and CCD 50. It should be noted that the diffracted first order light 47 of zone-plate 42 is the useful target imaging region of light beam 48 reflected from mask 46.

Consequently, CCD 50 serves as a detector for revealing any imperfections on surface 44 of mask 46. Such imperfections may appear as any anomalies on a screen associated with CCD 50. Charge coupled device 50 may take the form of an in-vacuum, cooled CCD manufactured by Great Eyes Gmbh of Berlin, Germany. Such CCD 50 has a pixel pitch range of: 13 μm×13 μm.

While in the foregoing embodiments of the application have been set forth in considerable detail for the purposes of making a complete disclosure of the application it may be apparent to those of skill in the art that numerous changes may be made in such details without departing from the spirit and principles of the application.

What is claimed is:

1. An EUV microscope apparatus for analyzing EUV masks, comprising:
   a source of EUV light;

a monochromator, said monochromator receiving EUV light from said source and producing an outgoing focused EUV beam of light, said outgoing focused EUV beam being directed to bear on the mask for reflection therefrom as a reflected EUV beam;

a zone-plate, said zone-plate including a central obscuration, said zone-plate receiving said reflected EUV beam and passing a certain order of said reflected EUV beam; and a detector for receiving said certain order of said reflected EUV beams and producing an image thereof.

2. The apparatus of claim 1 which additionally comprises a collector for receiving EUV light from said source, said collector providing a certain focused EUV beam of light, and said EUV light received by said monochromator comprises said certain focused EUV beam of light from said collector.

3. The apparatus of claim 1 which additionally comprises an illumination module, said illumination module intercepting and reimaging said outgoing focused EUV beam of light from said monochromator directed toward the mask, and producing a reimaged EUV beam to the mask for reflection therefrom.

4. The apparatus of claim 2 in which said collector comprises two mirrors in series.

5. The apparatus of claim 4 in which said collector comprises flat mirror and an elliptical mirror in series.

6. The apparatus of claim 2 in which said collector comprises an elliptical mirror.

7. The apparatus of claim 2 in which said collector comprises an aspherical mirror.

8. The apparatus of claim 3 in which said illumination module comprises two mirrors in series.

9. The apparatus of claim 3 in which said illumination module comprises a flat mirror in series with an elliptical mirror.

10. The apparatus of claim 3 in which said illumination module comprises an aspherical mirror.

11. The apparatus of claim 3 in which said illumination module comprises an elliptical mirror.

12. The apparatus of claim 1 in which said source of EUV light comprises EUV light produced by the generation of a laser produced plasma.

13. The apparatus of claim 1 in which the source of EUV light is produced by the generation of discharge produced plasma.

14. The apparatus of claim 12 which additionally comprises a collector for receiving EUV light from said source, said collector providing a certain focused EUV beam of light, and said EUV light received by said monochromator comprises said certain focused EUV beam of light from said collector.

15. The apparatus of claim 13 which additionally comprises a collector for receiving EUV light from said source, said collector providing a certain focused EUV beam of light, and said EUV light received by said monochromator comprises said certain focused EUV beam of light from said collector.

16. The apparatus of claim 12 which additionally comprises an illumination module, said illumination module intercepting and reimaging said outgoing focused EUV beam of light from said monochromator directed toward the mask, and producing a reimaged EUV beam to the mask for reflection therefrom.

17. The apparatus of claim 13 which additionally comprises an illumination module, said illumination module intercepting and reimaging said outgoing focused EUV beam of light from said monochromator directed toward the mask, and producing a reimaged EUV beam to the mask for reflection therefrom.

* * * * *